United States Patent
Farley et al.

(10) Patent No.: US 8,970,419 B2
(45) Date of Patent: Mar. 3, 2015

(54) WINDOWING FOR HIGH-SPEED ANALOG-TO-DIGITAL CONVERSION

(71) Applicant: Xilinx, Inc., San Jose, CA (US)

(72) Inventors: Brendan Farley, Donabate (IE); James Hudner, Charleville (IE); Ivan Bogue, Glanmire (IE); Declan Carey, Douglas (IE); Darragh Walsh, Leap (IE); Marc Erett, Ballincollig (IE)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/928,798

(22) Filed: Jun. 27, 2013

(65) Prior Publication Data
US 2015/0002326 A1    Jan. 1, 2015

(51) Int. Cl.
*H03M 1/34*   (2006.01)
*H03M 1/12*   (2006.01)

(52) U.S. Cl.
CPC ...................................... *H03M 1/12* (2013.01)
USPC ........................... 341/158; 341/155; 341/159

(58) Field of Classification Search
CPC ....................................................... H03M 1/00

USPC .......................................... 341/155, 159, 158
See application file for complete search history.

(56) References Cited

U.S. PATENT DOCUMENTS

| | | | | |
|---|---|---|---|---|
| 3,877,025 | A * | 4/1975 | Maio | 341/159 |
| 6,404,372 | B1 * | 6/2002 | Heithoff | 341/155 |
| 7,064,693 | B1 * | 6/2006 | Huang et al. | 341/120 |
| 7,405,688 | B2 * | 7/2008 | Prestros | 341/155 |
| 7,417,576 | B2 * | 8/2008 | Prestros | 341/164 |
| 7,565,559 | B2 * | 7/2009 | Chapuis | 713/300 |
| 2008/0136391 | A1 * | 6/2008 | Xiao et al. | 323/283 |
| 2009/0267821 | A1 | 10/2009 | Chmelar et al. | |
| 2009/0303093 | A1 | 12/2009 | Gribok et al. | |
| 2010/0214147 | A1 * | 8/2010 | Koyama | 341/158 |

FOREIGN PATENT DOCUMENTS

EP            1 367 720 A1    12/2003

* cited by examiner

*Primary Examiner* — Jean B Jeanglaude
(74) *Attorney, Agent, or Firm* — W. Eric Webostad; Lois D. Cartier (57) ABSTRACT

An analog-to-digital converter ("ADC"). The ADC includes a bank of comparators and a window controller. The window controller is coupled to the bank of comparators to selectively activate first comparators of the bank of comparators associated with a window size and to selectively inactivate second comparators of the bank of comparators.

16 Claims, 7 Drawing Sheets

WINDOWING FOR HIGH-SPEED ANALOG-TO-DIGITAL CONVERSION

TECHNICAL FIELD

The following description relates to integrated circuit devices ("ICs"). More particularly, the following description relates to windowing for high-speed analog-to-digital conversion for an IC.

BACKGROUND

A conventional serializer-to-deserializer ("SERDES") receiver has an analog architecture used to perform a combination of continuous time analog equalization and analog decision feedback equalization. However, more recently, an analog-to-digital converter ("ADC") has been used to digitize a received analog signal and then perform digital equalization and digital data recovery.

Because of the high speeds used by some SERDES, an ADC used for this purpose is conventionally a flash ADC, also known as a direct-conversion ADC or a parallel ADC. A flash ADC conventionally includes a bank of comparators for sampling an input signal in parallel. Every comparator in such bank is used for each sampling cycle, where each comparator has an associated voltage range. Direct conversion via a flash ADC is capable of gigahertz sampling rates, and so flash ADCs are useful in high bandwidth or wideband applications, where resolution may be limited to 8-bits or so. However, such speed comes at a price of a high input capacitance and high power dissipation Hence, it would be useful to provide a flash ADC that overcomes or mitigates one or more of these limitations.

SUMMARY

An apparatus relates generally to an analog-to-digital converter ("ADC"). Such an ADC includes a bank of comparators and a window controller. The window controller is coupled to the bank of comparators to selectively activate first comparators of the bank of comparators associated with a window size, and to selectively inactivate second comparators of the bank of comparators.

Another apparatus relates generally to a window controller. Such a window controller includes a profiler, at least one look-up table, a window position generator, and a selective activation block. The profiler is coupled to receive a feedback control signal to provide a rate of change signal. Such at least one look-up table has a set of granularity values and a set of window size values where a window granularity value and a window size value are selectable therefrom responsive to the rate of change signal. The window position generator is coupled to receive the feedback control signal to provide a window position value. The selective activation block is coupled to receive the window granularity value, the window size value, and the window position value to provide a set of activation signals.

A method relates generally to analog-to-digital conversion. In such a method, an analog input signal is received by an ADC. The analog input signal is converted to a digital serial output signal with the ADC. For such conversion, a rate of change is determined of the analog signal. A window position is generated for conversion of a windowed portion of the analog signal. A window size and a window granularity are selected for the windowed portion responsive to the rate of change. A set of activation signals is provided responsive to the window size, the window granularity, and the window position for the conversion of the windowed portion of the analog signal. Such determining, generating, and selecting operations are all performed in the digital domain.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

DETAILED DESCRIPTION

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Before describing the examples illustratively depicted in the several figures, a general introduction is provided to further understanding. As previously described, high-speed analog-to-digital conversion heretofore was a significant consumer of power when using a flash analog-to-digital converter ("ADC"). To reduce such power consumption, a flash ADC is described below that dynamically windows which comparators are active and which are not during a sampling cycle or phase. In ADC-based serial transceivers or receivers, only a fraction of an ADC dynamic range may be used from sample-to-sample during some operations. As described below in additional detail, a receiver architecture can take advantage of this limited use of dynamic range to reduce power consumption. For a high channel loss, an analog signal may only traverse a fraction of an ADC signal range from a current sample to an immediately next sample, and so only a sub-range of an ADC's dynamic range may be instantaneously used by dynamically windowing. For low channel loss, a signal-to-noise ratio may be high, and so resolution of an ADC can be reduced.

Even though high-speed sampling of high frequency spectral components is generally described, the following description may be applied to other fields where signal spectral components are concentrated in low frequencies relative to an ADC Nyquist band. With the above general understanding borne in mind, various examples of a flash ADC are generally described below.

Because one or more of the above-described examples are described herein using a particular type of IC, a detailed description of such an IC is provided below. However, it should be understood that other types of ICs may benefit from one or more of the techniques described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that interconnects the various elements on the device in a programmable manner. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that interconnects the hard-coded transistor logic in a programmable manner.

Figure 1:
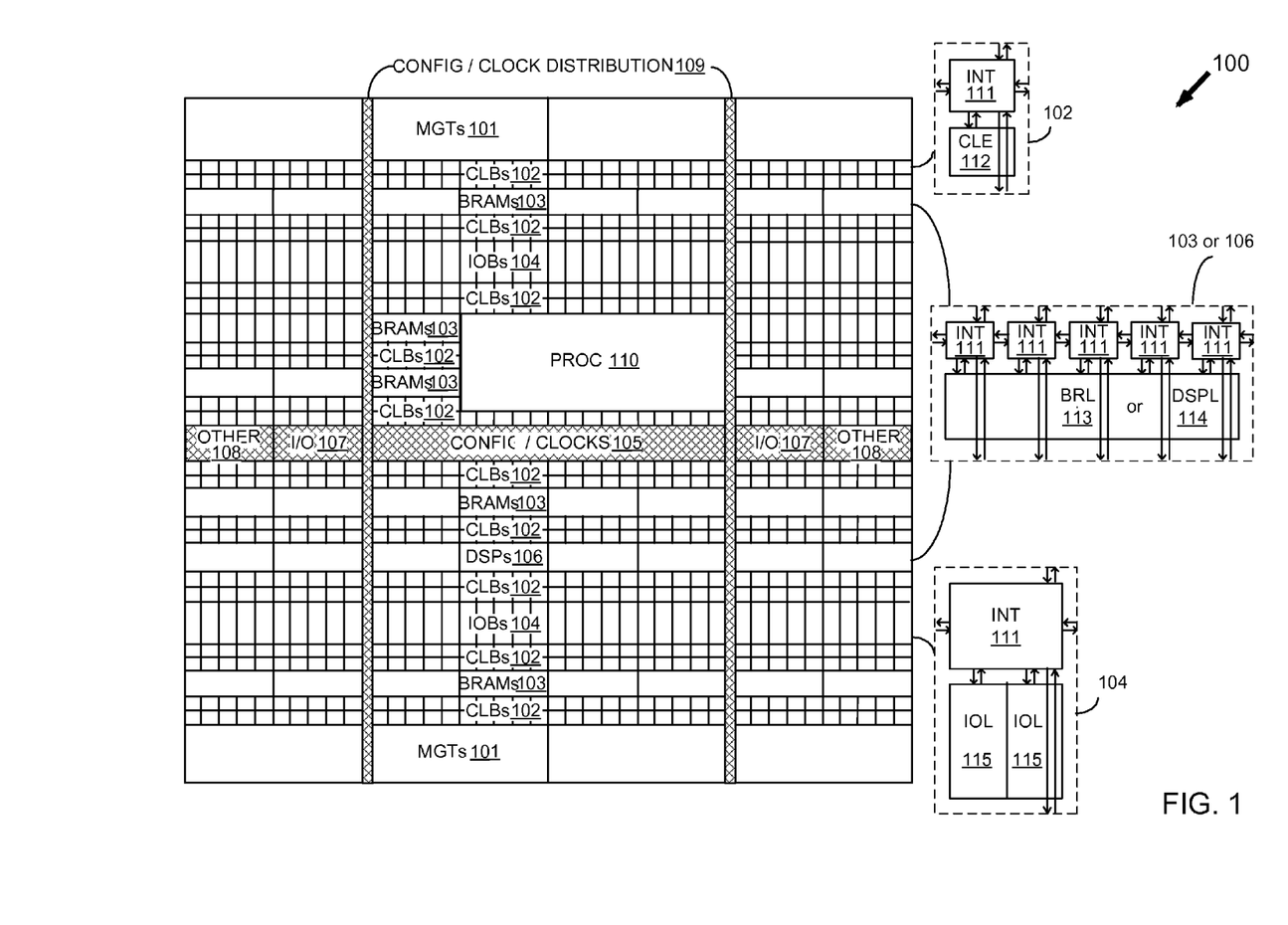
FIG. 1 is a simplified block diagram depicting an exemplary columnar Field Programmable Gate Array ("FPGA") architecture.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An 10B 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 2:
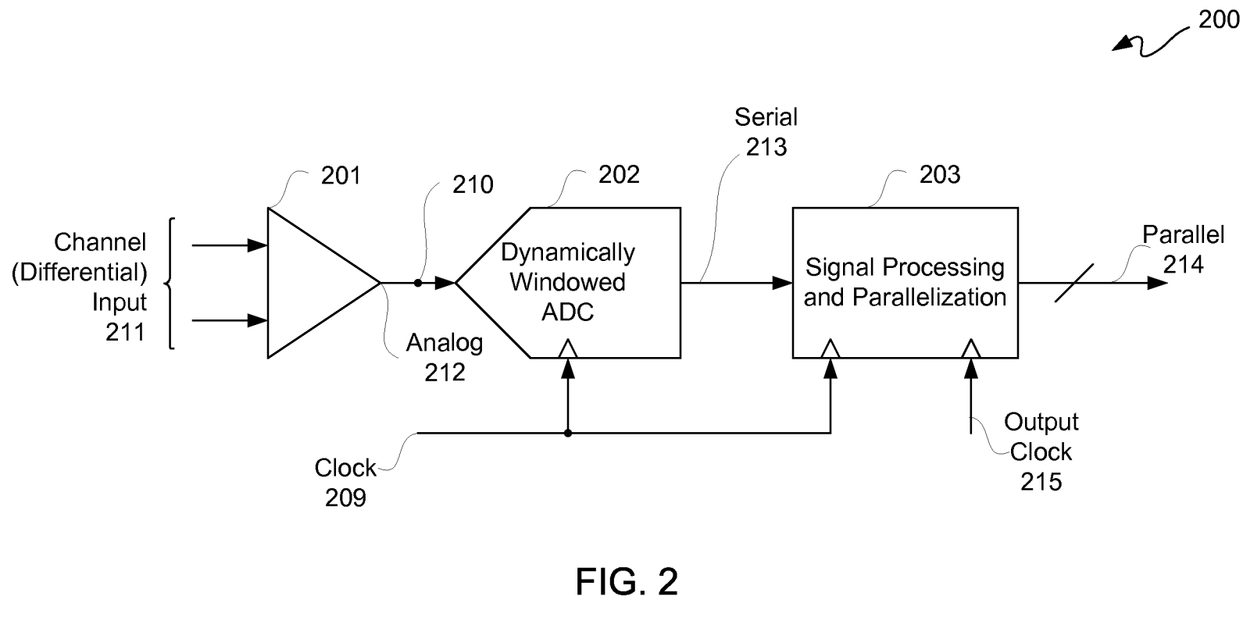
FIG. 2 is a block/circuit diagram depicting an exemplary serializer-deserializer ("SERDES").

FIG. 2 is a block/circuit diagram depicting an exemplary serializer-deserializer ("SERDES") 200, such as of an FPGA 100 or other integrated circuit. SERDES 200 is for high-speed operation. By high-speed operation, it is generally meant at least 10 giga-samples per second.

In this example, a receiver driver 201 is coupled to two channels to receive a differential input 211. Output of receiver driver 201 may be an analog signal 212 which is provided to a common input node 210 for input to a dynamically windowed analog-to-digital converter ("ADC") 202. In an ideal or lossless environment, differential input 211 would have the same voltage range as when initially sent by a transmitter. However, conventionally, differential input 211 is attenuated during transmission from a transmitter to receiver driver 201. Along those lines, such attenuation may be greater than 20 decibels. Even though differential signaling is described herein for purposes of clarity by way of example, other types of signaling, such as single-ended signaling for example, may be used in accordance with the following description.

For such an attenuated differential input 211, the maximum amount of deviation from sample-to-sample is substantially less than in for example a lossless environment. Conventionally, differential input 211 is a signal converted with some form of coding, such as a form of QAM, QPSK, or other form of signal manipulation. Thus, sample-to-sample may be thought of as symbol-to-symbol or some other form of coding. However, generally for ADC 202 this means that the maximum number of steps from a current step to a next step for converting an analog signal to a digital signal is substantially less for a heavily attenuated signal than for a lossless signal.

ADC 202 may be coupled to receive a sampling signal, such as may have a clock pattern for example. In this example, such sampling signal is clock signal 209. ADC 202 may be what is known as a flash, direct conversion, or parallel ADC, namely ADC has a bank of comparators for high-speed operation. Unfortunately, this heretofore also meant high power consumption; however, as described below in additional detail windowing may be used to reduce the amount of power consumed.

By reducing the amount of power consumption, ADC 202 may be used in applications where a high-speed SERDES is sought but where power consumption is a significant performance limitation. In other words, ADC 202 may be used to provide both high performance and low power consumption. Examples of uses may include a base station, a router, an optical or wireline transport network, and a back plane, among other applications in which a SERDES may be used.

Output of ADC 202 is a serial signal 213, which may be provided to a signal processing and parallelization block 203. Signal processing and parallelization block may be clocked with clock signal 209 for input of data thereto, and may be clocked with clock signal 215 for output of data therefrom. Optionally, signal processing and parallelization block 203 may be configured for clock data recovery ("CDR"). Output of signal processing and parallelization block 203 may be parallel signals 214.

At this point, it should be borne in mind that analog signal 212 may have little to no analog preprocessing prior to input to ADC 202. In other words, by providing windowing of an ADC as described herein for example, there may be no intervening analog signal processing blocks between output of receiver driver 201 and common input node 210 of ADC 202. Of course, some analog processing circuitry may be coupled between receiver driver 201 and ADC 202, such as track and hold circuitry for example to reduce sparkle.

Having little to no intervening circuitry between receiver driver 201 and ADC 202 may reduce circuit overhead and power consumption, and may facilitate greater throughput. This also may facilitate signal processing to be performed in the digital domain instead of the analog domain. Digital processing, such as digital equalization and digital data recovery, such as may be used by a SERDES for example, may provide greater flexibility, scaling of digital power use and semiconductor area with progressively smaller lithography, efficiency in design porting, and/or improved testability, and the like. Along those lines, ADC 202 may employ windowing which covers a current or instant sample, such as a current symbol or time frame for example, as well as one or more immediately next or following sample(s), as described below in additional detail. Windowing of comparators, as well as other selective activation of comparators as described below, may be used to reduce power consumption. Such windowing and/or selecting of which comparators are active may further reduce input capacitance of a flash ADC 202.

ADC 202 may be configured to have a window size which covers a current sample and a next sample, where such next sample may be one or more steps away from a current sample. In another example, ADC 202 may be configured to have a window size which covers a current sample and a plurality of subsequent samples. Such window associated with such window size may, though need not be, centered to a threshold of a current sample. In another example, such window may be asymmetrically oriented with respect to such threshold of a current sample depending on direction of change. Thus, generally it should be understood that only a fraction of an ADC dynamic range may be used from sample-to-sample in a SERDES receiver. Thus, by dynamically windowing, only a portion of comparators in a flash ADC may be activated at a time and another portion of such comparators may be inactivated during such time in order to reduce power consumption. Along those lines, in an application, many of the comparators may be inactivated during a conversion of an analog sample to a digital sample. For example, at least 80 percent of the comparators of a bank of comparators may be inactive for a sampling cycle. Of course, the number of comparators that may be deactivated or inactive may vary from application-to-application, and the example of at least 80 percent may be larger or smaller as may vary from application-to-application. Accordingly, general terms are used below to describe the various applications.

Figure 3:
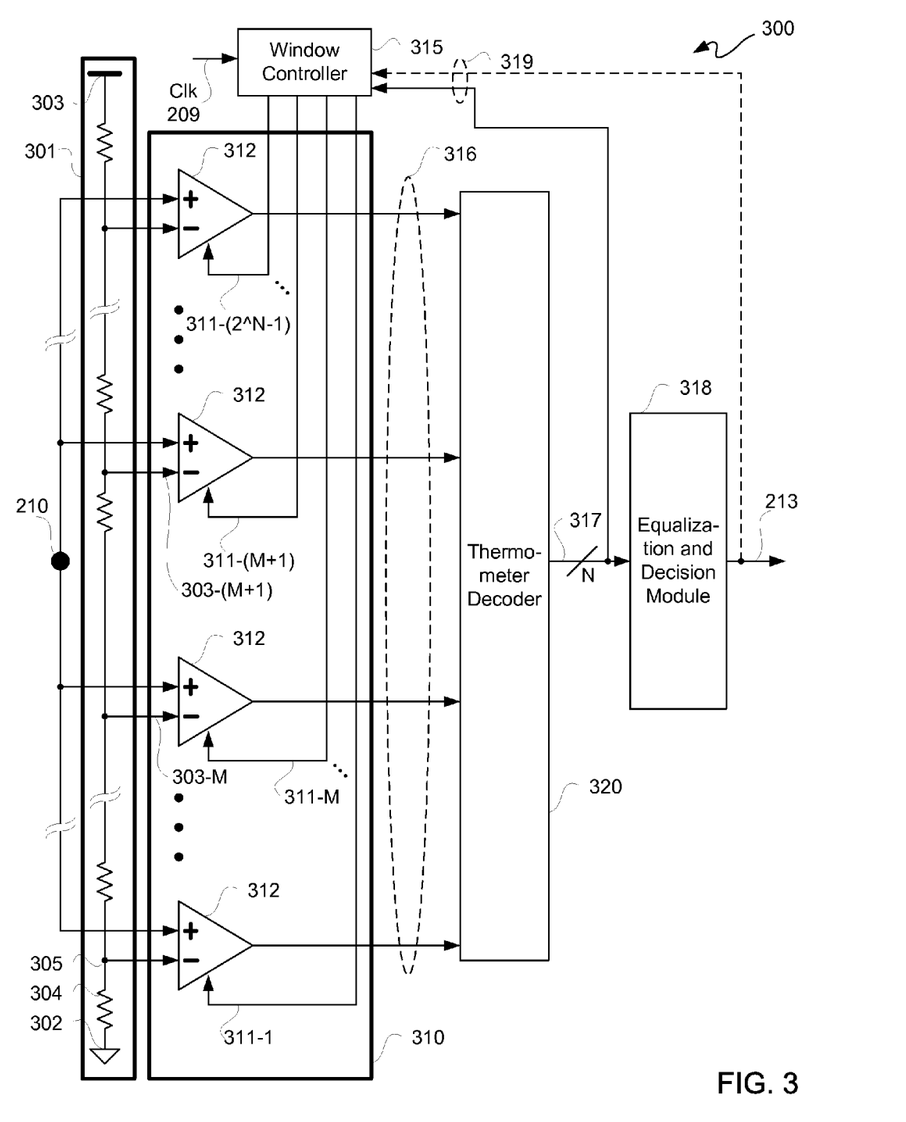
FIG. 3 is a block/circuit diagram depicting an exemplary flash analog-to-digital converter ("ADC").

FIG. 3 is a block/circuit diagram depicting an exemplary flash ADC 300. ADC 300 may be ADC 202 of FIG. 2. Even though an example of a flash ADC is used due to operation at a high frequency, such as 10 GHz or above, it should be understood that other types of ADCs may be used as may be associated with slower frequencies of operation than a flash ADC. Furthermore, even though sampling at the symbol rate is assumed, it should be understood that oversampling or subsampling or sampling generally at or near a Nyquist rate may be used.

ADC 300 may have a common input node 210, which may be coupled to receive an analog signal. ADC 200 may be an N-bit converter, for N a positive integer greater than 1. Along those lines, a bank of comparators 310 may include $2^N-1$ comparators 312. An input of each of comparators 312, which in this example is a plus input port, may be coupled to common input node 210. In this example, common input node 210 is coupled to plus input ports of comparators 312; however, in another configuration, common input node 210 may be coupled to minus input ports of comparators 312.

Comparators 312 may be formed using a cascade of wideband and low-gain stages. Comparators 312 may have a low-voltage offset, where an input offset of each comparator 312 is smaller than an LSB of ADC 300. A regenerative latch or dynamic latch generally at the end of each comparator 312 may be used to store and output a result therefor. Each such latch may have positive feedback, so that an end state or output is forced to be either a logic 1 or 0. As such comparators are known, they are not described in unnecessary detail herein.

A resistor ladder 310, which may include $2^N$ resistors 304 coupled in series between a reference voltage source 303 and ground 302, is a resistor-divider or voltage-divider network coupled to bank of comparators 310. More particularly, between series adjacent pairs of resistors 304 may be nodes or taps 305, and taps 305 may be respectively coupled to input ports of comparators 312. In this example, taps 305 are respectively coupled to minus ports of comparators 312; however, in another configuration, taps 305 may be respectively coupled to plus ports of comparators 312. Along those lines, resistors 304 may each have a resistance such that a reference voltage provided from a tap 305 to a comparator 312 is one least significant bit ("LSB") greater than a reference voltage from a next immediately below tap 305 provided to a next immediately below comparator 312.

A comparator 312, when sampled during a sampling phase associated with clock signal 209 for example, may produce a logic 1 output when an analog input voltage is greater than a reference voltage input and may output a logic 0 when an analog input voltage is less than or equal to a reference voltage input. Thus for example, if a reference voltage 303-(M+1) and a reference voltage 303-M of M+1 and M comparators 312 is respectively greater than and less than an analog input voltage at analog voltage input node 210, then M+1 to $2^N-1$ comparators 312 may each output a logic 0 and 1 to M comparators 312 may each output a logic 1. Outputs of comparators 312 may thus collectively produce a digital thermometer code 316 for input to a thermometer decoder 320. Optionally, gray-code encoding may be used, which is later decoded to binary.

In response to a digital thermometer code 316, thermometer decoder 320 may produce a digital code or digital coded signal 317. Digital code 317 may be N bits wide, which may be provided as a N-bit wide serial output, for providing as an input to an equalization and decision module 318. In response to a digital code 317, equalization and decision module 318 may produce a serial digital output 213.

A point or location at which digital thermometer code 316 changes from one or more logic 1s to one or more logic 0s is generally where an analog input voltage is located, subject to granularity of resistor ladder 310. This may be referred to as a threshold analog voltage, which may be interpreted as a location at which an analog input voltage is smaller than all reference voltage inputs above such threshold analog voltage. However, as described below in additional detail, in many instances having all comparators active to process input analog voltages is unnecessary, and so dynamic windowing may be used to selectively activate some of such comparators 312 while maintaining or deactivation others of such comparators 312.

A sampling signal, such as clock signal 209, may be provided to a window controller 315. Window controller 315 may further be coupled to receive a feedback control signal 319. Output of window controller 315 may be a plurality of activation/deactivation signals 311-1 through 311-$(2^N-1)$ ("activation/deactivation signals 311") respectively provided to comparators 312. Activation/deactivation signals 311 may be to couple or decouple associated comparators 312 to or from a ground and/or a supply voltage, may be to activate or deactivate a comparator latch circuit, or otherwise may be used to conserve power by otherwise deactivating a first portion of comparators 312 while activating or maintaining active an window sized second portion of comparators 312.

For purposes of clarity by way of example and not limitation, it shall be assumed that activation/deactivation signals 311 are provided as phase signals or sampling signals. Thus, for example, if a comparator 312 is provided with an asserted sampling signal 311, then such comparator 312 is in an active state. In an active state, such comparator 312 may have one or more transistors thereof transition to indicate a change in state of an analog input voltage with respect to a static or at least substantially static reference input voltage responsive to an active sampling signal 311.

If, however, for example a comparator 312 is provided with a de-asserted or non-asserted sampling signal 311, then such comparator 312 is in a deactivated or inactive state. In an inactive state, such comparator 312 effectively is not clocked by a de-asserted sampling signal 311, and thus one or more transistors thereof may not transition. By preventing transitioning of transistors of unused comparators 312 for an analog-to-digital conversion, less power is consumed for such conversion for example with respect to having all of such comparators 312 receive an asserted sampling signal 311. Furthermore, by not decoupling such comparators 312 from power and/or ground for deactivation, such comparators 312 may quickly be activated when they are to be readied for use for analog-to-digital conversion. Along those lines, such comparators 312 may be operated for high-speed sampling and thus may be dynamically operated. So rather than turning on or off current to comparators 312 or activating or deactivating a dynamic latch at the back end of such comparators 312, a clock activation or deactivation input to such dynamic comparators may be turned on or off so as to reduce power consumption, as described below in additional detail. Even though examples are provided herein with respect to selectively disabling or turning off flash ADC comparators, it should be appreciated that these or some combination of these, or other ways for disabling ADC comparators, may be used.

At this juncture, it should be appreciated that an input analog voltage may have an identified threshold voltage location based on adjacent comparators 312 in a vertical ladder network or bank having different outputs. If such location were in the exact middle of the $2^N-1$ comparators 312, then generally half of comparators 312 would output a logic 1 and the other half of comparators 312 would output a logic 0. However, step size from one sample to the next generally may not involve having to have so many comparators active at the same time. By identifying a rate of change of an analog signal, as well as optionally a direction of such change, a window size may be determined such that a significantly smaller subset of comparators 312 are used for sampling an analog input voltage for each sampling phase than for example using all or even half of comparators 312 for each sampling phase. Furthermore, location of such window may be positioned relative to a current location of such threshold analog voltage so as to be ready for a next sample or samples obtained during an immediately next sampling phase or a set of immediately next sampling phases, respectively. This positioning of a window with respect to a threshold analog voltage location may be symmetrical or centered to such location, or may be asymmetrically positioned up or down with respect to such location. Positioning of a window may thus involve a current threshold analog voltage location, as well as direction of change of such analog voltage input, and window width may be responsive to rate of analog voltage input change from sample-to-sample or over a multiplicity of consecutive samples or dV/dt, or a combination of one or more of these.

Figure 4:
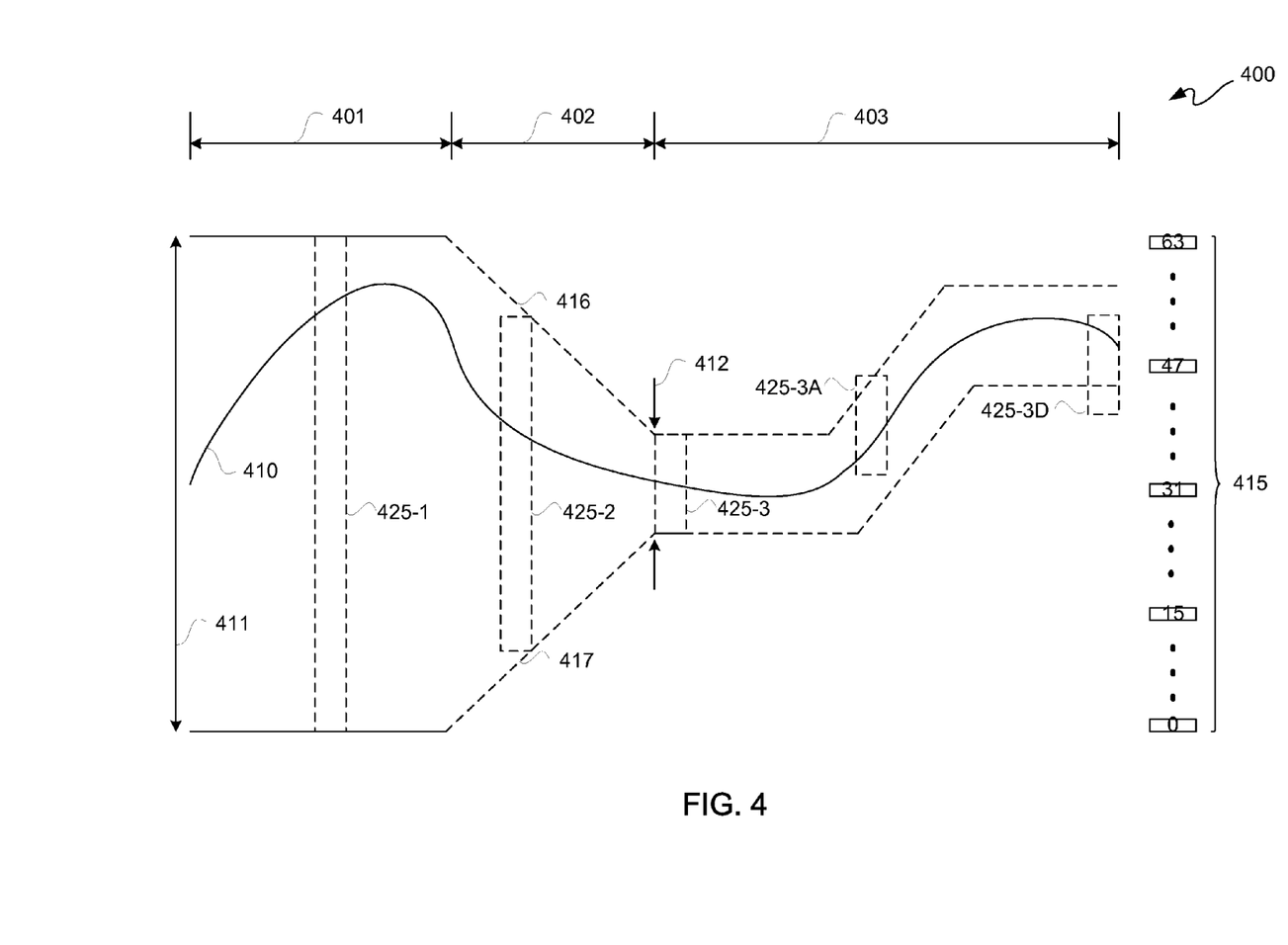
FIG. 4 is a graphic-flow diagram depicting an exemplary windowing flow.

FIG. 4 is a graphic-flow diagram depicting an exemplary windowing flow 400. Windowing flow 400 may be for operation of window controller 315 of FIG. 3, and thus windowing flow 400 is described with simultaneous reference to FIGS. 3 and 4.

During an initial stage or interval 401, window controller 315 may via asserted sampling signals 311 have all of comparators 312 of bank of comparators 310 active. For purposes of clarity by way of example and not limitation, it shall be assumed than N is equal to 6; however, in other examples other values for N may be used. Thus, a full-scale sampling is performed during initial sampling interval 401. This may be a default state for initial sampling of an analog input, such as generally indicated by an example analog voltage signal 410 for purposes of clarity by way of example and not limitation, as any analog input may be used.

During interval 401, all $2^N$ bits 415 of data, which in this example is 64 bits of data, may be provided to thermometer decoder 320 responsive to a full-scale sampling window, such as generally indicated as window 425-1. However, after interval 401, an interim interval 402 may immediately follow. As more information is obtained about analog voltage signal 410, a sampling window may be narrowed or otherwise reduced in size, as generally indicated by window 425-2 of interim interval 402. Over time, more signal information about an analog input signal, such as analog voltage signal 410 for example, is obtained, and a maximum change in voltage over time, namely dV/dt may be iteratively determined. This determination mathematically starts from full-scale sampling and progresses to a substantially narrower sampling size, as generally indicated by tapering lines 416 and 417 which may be associated with a tapering window, as generally indicated by window 425-2. Even though tapering lines 416 and 417 are generally indicated as being symmetric and linear, in other configurations such tapering may be asymmetric and/or non-linear. However, for purposes of clarity and not limitation, symmetry and linearity shall be assumed.

After a maximum dV/dt is determined, a window size 412 may be resolved for subsequent sampling of an analog input voltage during a final interval 403 immediately following interim interval 402. Even though symmetry is assumed, again it should be understood that a +dV/dt may be the same or different from a −dV/dt, namely step changes in voltage may be different or the same for ascending and descending directions of an analog input signal. Partial scale window size, as generally indicated by window 425-3, may be used for a remainder of sampling of analog voltage signal 410 through final interval 403. During final interval 403, window size has settled on window size 412, and window 425-3 may be center to and track with a most recent last code position of analog voltage signal 410. In this example, reduced window size 412 is approximately 16 segments, which is scaled down substantially from a 64 segment full scale window size. However, such reduced window size 412 in other examples may have a smaller reduced sampling window segments-to-total sampling segments ratio. The amount of reduction may vary from application-to-application. For example, in a low or no loss channel, only a mid-scale comparator may be used.

One way to further reduce such settled upon window size 412 is to reduce the number of sample intervals it spans. For example, a window size may be wide enough to cover a current sample plus a number k of steps from such current sample, where each of such steps is at most a maximum dV/dt. The number k may be an integer greater than 1. As the number k is reduced, namely as a reduced window size 425-3 covers fewer subsequent steps from a current position, window size 412 may likewise be reduced. A reason for having more than one step or sample covered by a reduced window size 425-3 is to account for a time delay associated with generating a feedback control signal 319. Thus, by shorting a feedback path for generation of feedback control signal 319, the number k may be reduced.

Furthermore, if an analog signal, such as for example analog voltage signal 410 is a priori known or predictable with respect to a direction of change, window 425-3 for example may be asymmetrically positioned with respect to a current position of analog voltage signal 410. For example, window 425-3A generally indicates an asymmetrically positioned window to account for analog voltage signal 410 increasing or ascending in voltage. Thus, window 425-3A is not centered to a current position of analog voltage signal 410 as is window 425-3, but is off-centered with respect to a current position of analog voltage signal 410 so as to provide more margin to capture one or more next steps or samples in an ascending direction of analog voltage signal 410. This asymmetric position of a sampling window to increase margin in one direction over another may be used to reduce k. It should be understood that for a high-speed ADC, windowing may cover more than one sample or step in order to provide sufficient bandwidth for accuracy. Even though window 425-3A is illustratively depicted for a bias in an ascending direction, asymmetric positioning of a window may likewise be used for analog voltage signal 410 descending as generally indicated by window 425-3D. Of course, there may be instances where responsive to analog voltage signal 410, a sampling window 425-3 is symmetrically positioned in some instances and asymmetrically positioned in other instances responsive to predicted behavior of an analog input signal.

Digital code 317 indicates a current position or threshold position of an analog input voltage. Thus, from one sample to a next sample, any change in digital code 317 may be determined. Thus, in the above example, a 6-bit ADC digital code 317 may be provided as control feedback signal 319. Window controller 315 may be configured to determine differences or equalities between successive ADC digital codes 317 as signal history. This signal history may be temporarily stored for determining a maximum dV/dt, in either or both a positive direction and a negative direction. Such dV/dt is to determine a rate of change in a digital domain. Each such maximum dV/dt may be used to set a window size along with a number of steps k to be covered, as previously described. Optionally or additionally, serial digital data 213 may be used to provide control feedback signal 319, as previously described but with differences or equalities being between successive samples of serial digital data 213. This information may be used to determine a maximum dV/dt separately from or in addition to ADC digital codes 317. Generally, if a rate of change dV/dt is small, then a channel associated therewith may be determined to be a high loss channel. If, however, a rate of change dV/dt is large, then a channel associated therewith may be determined to be a low loss channel. Thus, window width may be a function of both amplitude and frequency of change. Furthermore, window width may be based on where on an analog voltage signal a current sample is. For example, for a sinusoid, excursions from samples in the middle are generally much larger than excursion at either top or bottom amplitudes of such signal. Along those lines, window size may be adjusted according to a current sample position.

Of course, there are many types of analog signals with different types of behaviors. For example, in a low-loss channel, a reduced window size may not be substantially reduced in comparison to a full-scale window. Along those lines, during interval 401, a profile of an input channel or channels may be determined from a data profile of such captured analog signal, namely as indicated by ADC digital code 317 and/or serial digital data 213. However, for a lower loss channel, such as for example less than 20 dB attenuation, a same ADC resolution may not be needed as in a high-loss channel, such as for example greater than 20 dB attenuation. Along those lines, window controller 315 may be configured to use a determined channel profile to determine a window resolution to use. For clarity, only low-loss and high-loss channels are described herein; however, these or other delineations may be used, and more than two groups may be used. For example, a low-loss channel may have a larger sized window with a more selective activation of comparators, and a high-loss channel may have a small sized window with activation of all comparators therein. By a more selective activation of comparators for a large sized window, a step size Q of which comparators are activated by window controller 315 within such window may be used. For example, depending on dynamic range of an input, step size Q may be from approximately 4 to 8, meaning that within a large window one in every 4 to 8 comparators within such window may be activated by window controller 315 by asserting a subset of sampling signals 311 associated with such window to reduce power consumption.

Again, asymmetric positioning or skewing of a window may be used for instances where a window size is undesirably large. Along those lines, a current sample position in an ADC range or bit range 415 may be used to predict a next sample position, and a window 425 may be skewed accordingly to reduce window size. Furthermore, a profile of data may suggest asymmetric window positioning. Additionally, if a window size is too large or has increased margin due to asymmetric positioning, selective activation of comparators within such window may be used to reduce power consumption. For example, every other comparator within such window may effectively be de-asserted, again depending on dynamic range of an input signal, so as to reduce power consumption.

With the above description borne in mind, a signal-to-noise ratio ("SNR") may be used by module 318. Thus, a sufficient number of comparators may be turned on or off such that an SNR of digital thermometer code 316 is sufficient for proper operation of equalization and decision module 318. Along those lines, if SNR is too low, a number of comparators 312 not involved in conversion of a current or next sample may be activated in order to reduce noise and thus increase an SNR.

Figure 5:
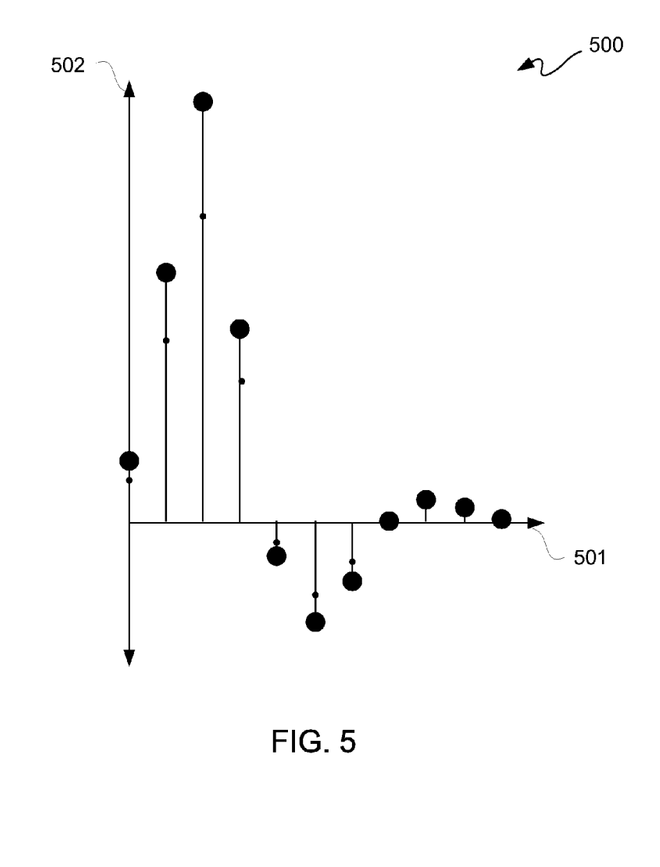
FIG. 5 is a graphical diagram depicting an exemplary impulse response of a channel.

FIG. 5 is a graphical diagram depicting an exemplary impulse response 500 of a channel. This is just an exemplary impulse response of a channel, and any other channel impulse response may be used. A channel impulse response contains the full frequency spectrum of channel in a series of time domain values and may also be used to determine a maximum voltage step between samples and thus a window size to be used. Generally, a channel's impulse response does not vary or change much for a steady state system. For example, a backplane may be coupled to multiple computers. If computers are added, removed, or swapped, then a channel response may change for different system configurations. However, for a system configuration, generally a channel impulse response does not change significantly. Horizontal axis 501 is for number of samples of an input analog signal, and vertical axis 502 is for amplitude.

With simultaneous reference to FIGS. 3 through 5, to maximize power efficiency, it may be useful to know how many comparators 312 are to be on. Thus, during an initial interval 401, a channel impulse response may be determined, for example with all of comparators 312 active. A maximum expected inter-code voltage step may be determined from this channel impulse response. By "maximum expected inter-code voltage step", it is generally meant a maximum step size going from one sample to an adjacent sample for an ADC code for a channel impulse response. This again may indicate a maximum rate of change. In other words, this maximum expected inter-code voltage step may set a maximum voltage span to cover a worst case, assuming a window is centrally positioned.

Figure 6:
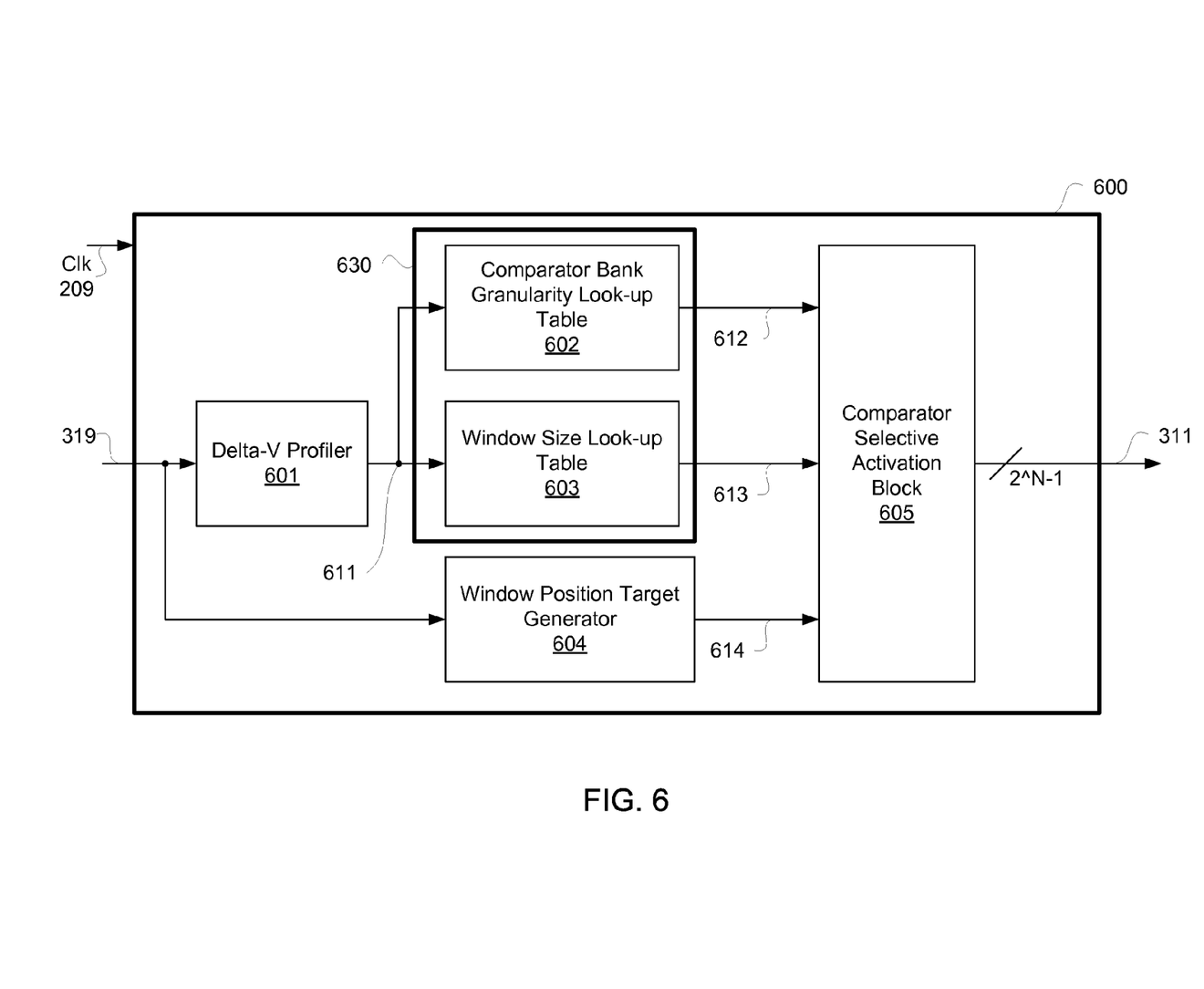
FIG. 6 is a block diagram depicting an exemplary window controller.

FIG. 6 is a block diagram depicting an exemplary window controller 600, which may be window controller 315 of FIG. 3. A clock signal 209 may be provided to window controller 600 for operation thereof; however distribution of clock signal 209 is not illustratively depict for purposes of clarity. Window controller 600 may be configured to determine size, center-point and number of comparators to be activated within a window, namely granularity within a window, for subsequent ADC conversions.

In this example, window controller 600 includes a change-in-voltage ("Delta-V") profiler 601, a comparator bank granularity look-up table 602, a window size look-up table 603, a window position target generator 604, and a comparator selective activation block 605. Delta-V profiler 601 may be coupled to receive feedback control signal 319 and may be configured to determine rate of voltage change responsive to two or more values from this digitized feedback control signal 319 using in part clock signal 209. This determination may include but is not limited to dV/dt analysis and processing of two or more current and/or previous sample values to determine low frequency component impact on a next step size. For example, a single tone may be mathematically described in terms of its amplitude (A) and frequency (f) as $A \sin(2\pi ft)$ at time t. The rate of change of this signal is the derivative of this mathematical description or $A2\pi f \cos(2\pi ft)$, and so the maximum rate of change is $A2\pi f$. In other words, a maximum rate of change is proportional to amplitude and signal frequency.

Window-size look-up table ("LUT") 603 may be coupled to receive a rate of change output 611 from Delta-V profiler 601. Window-size LUT 603 may be configured to determine a size or span of a window based on a maximum rate of change of a signal, which may be determined by using two or more sample values from rate of change output 611. For example, as previously described for a high signal power and rate of change, a window size may be full scale.

Comparator bank granularity LUT 602 may be coupled to receive rate of change output 611 and may be configured to determine a number of comparators to be activated across a sampling window responsive to one or more sample values of rate of change output 611. In order for a flash ADC system to recover an accurate replica of an original serial bit stream, namely a replica stream with a low bit error rate (BER), a minimum signal-to-noise ratio ("SNR") may be maintained at an input to a digital back-end of such system. For example, with high signal power, only a subset of comparators across a sampling window may be activated to maintain a threshold minimum SNR.

Optionally, LUTs 602 and 603 may be a single LUT 630 having a first set of granularity values associated with various values obtained from rate of change output 611 and having a second set of window size values also associated with various values obtained from rate of change output 611. Thus, such a LUT 630 may have respective pairs of a window granularity value stored and a window size value.

Window position-target generator 604 may be coupled to receive feedback control signal 319 and may be configured to determine a target position for a sampling window, for example for centering of such sampling window, responsive to two or more sample values of such feedback control signal 319. Window position-target generator 604 may be configured to determine a target position of a sampling window, based on a current position and a maximum possible deviation in a positive or negative direction from an interior location within such window. Thus, a sampling window may be symmetrically positioned or asymmetrically positioned with a bias in either a positive or negative direction, such as previously described.

Comparator selective activation block 605 is coupled to receive a window granularity output 612 from comparator bank granularity LUT 602, a window size output 613 from window size LUT 603, and a window position output 614 from window position target generator 604. Using a window granularity value or step size from window granularity output 612, a window size value from window size output 613, and a window position value from window position output 614, comparator selective activation block 605 is configured to generate an array of comparator activation signals, as well as deactivation signals, for windowing in a flash ADC, such as previously described.

In a low loss environment, signal attenuation through a channel is low, resulting in high signal amplitude (A) and thus a fast maximum rate of change. Because signal power is high, the quantization noise power of a flash ADC can be relaxed while maintaining a threshold minimum SNR at the input to a digital back-end. In this environment, a process of window controller 600 may set-up a large, such as a full scale for example, window size with a reduced comparator granularity and a window center-point at or near the flash ADC mid-range.

In a high loss environment, signal attenuation through a channel is high, resulting in low signal amplitude (A) and thus a reduced maximum rate of change. Because signal power is low, to maintain at least a threshold SNR the comparator granularity within the window cannot be relaxed. However, since rate of change of a signal is reduced in such environment, a process of window controller 600 may set-up a small window size with a center-point determined by a current signal position and a maximum possible deviation in positive or negative direction from such center-point determined. Again, a symmetric or asymmetric overall positioning may be used.

In a medium loss environment, signal attenuation through a channel is medium, resulting in medium signal amplitude (A) and thus a medium maximum rate of change. Because signal power is higher than in the example of the previous paragraph, to maintain at least a threshold SNR, comparator granularity within the window can be relaxed somewhat. Furthermore, since the rate of change of signal is higher, a process of window controller 600 may set-up a larger window size with a center-point determined by a current signal position and a maximum possible deviation in positive or negative direction from such center-point determined. Again, a symmetric or asymmetric overall positioning may be used.

Figure 7:
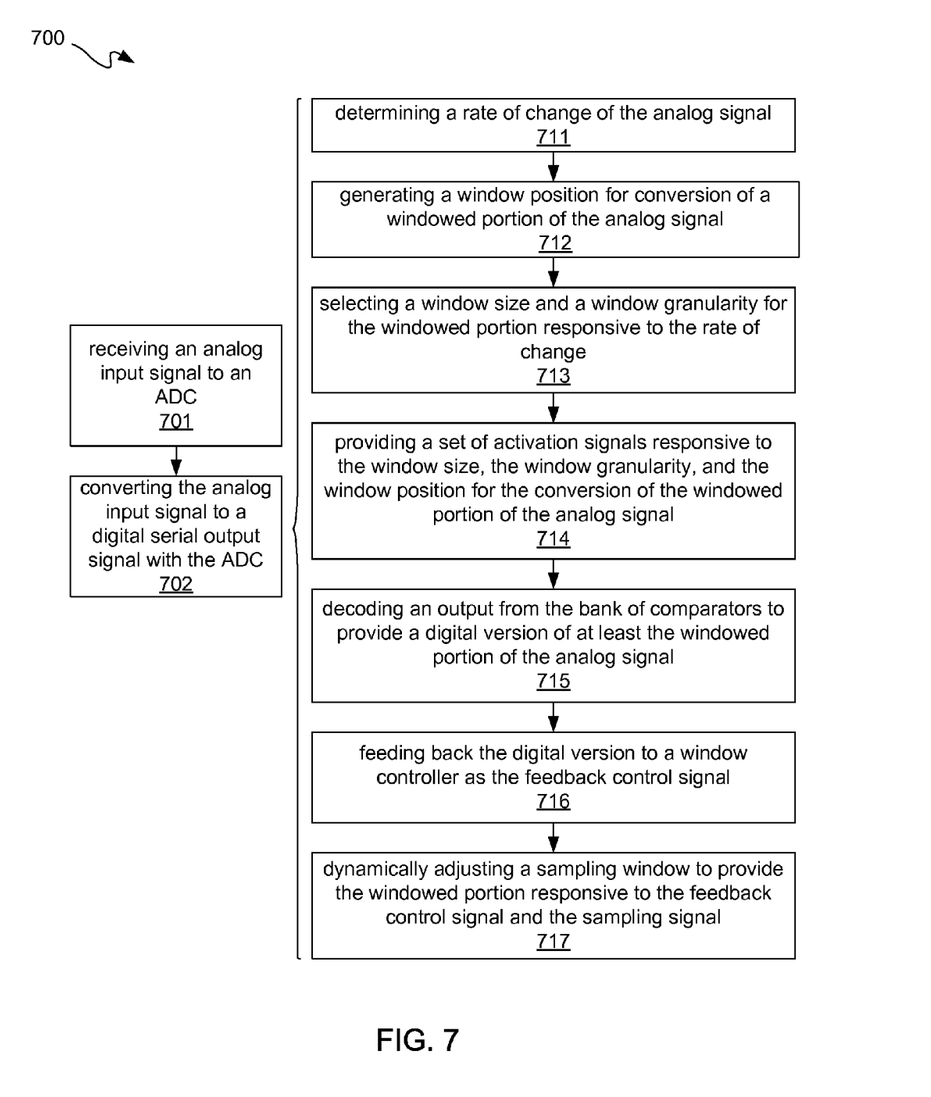
FIG. 7 is a flow diagram depicting an exemplary windowed analog-to-digital conversion flow.

With the above description borne in mind, FIG. 7 is a flow diagram depicting an exemplary windowed analog-to-digital conversion flow 700. At 701, an analog input signal to a windowed ADC, such as ADC 300 of FIG. 3 for example. At 702, such analog input signal is converted to a digital parallel output signal with such ADC. Along those lines, a windowed ADC as described herein may be part of a SERDES.

Conversion at 702 may include determination at 711, generation at 712, selection at 713, and provision at 714, each of which is described below in additional detail. At 711, a rate of change of an analog signal may be determined. As previously described, this rate of change may be determined from a full scale analog signal, a reduced portion of the analog signal or somewhere in between these two. At 712, a window position may be generated for conversion of a windowed portion of such analog signal. At 713, a window size and a window granularity may be selected for such windowed portion responsive to such rate of change. Selection of a window size and a window granularity may be a single operation when such values are stored as pairs, or may be separate operations when such values are not stored as pairs, such as previously described. Furthermore, operations at 712 and 713 may be performed in parallel. At 714, a set of activation signals responsive to such window size, window granularity, and window position may be provided for conversion of such windowed portion of such analog signal.

As previously described, operations at 711 through 713 may all be performed in a digital domain. Furthermore, as previously described, operations at 711 through 713 may all be performed dynamically responsive to a feedback control signal and a sampling signal. Along those lines, a bank of comparators of an ADC may be coupled to a window controller to selectively activate a first portion of comparators of such bank of comparators as associated with such set of activation signals provided at 714. Further, at 714, a second set of deactivation signals may be provided to selectively inactivate a second portion of comparators of such bank of comparators not part of such set of activation signals. By inactivate, it should be understood to include transition from an active state to an inactive state and/or maintaining in an inactive state.

Thus, a window controller may receive a sample clock signal and a digital feedback control signal to dynamically window such first portion of comparators for activation. As previously described, such set of activation signals may be provided at 714 to a bank of comparators for selective activation of a plurality of comparators of such bank of comparators, where rate of change of an analog input to such bank and a window position are dynamically adjusted responsive to a digital feedback control signal.

Along those lines, by having a feedback control signal provided as part of such conversion at 702, such conversion may further include decoding at 715, feeding back at 716, and dynamically adjusting at 717, each of which operations is described below in additional detail. At 715, an output from an ADC bank of comparators may be decoded to provide a digital version of at least a windowed portion of an analog signal during a conversion or sampling cycle. At 716, such digital version may be fed back to a window controller as a digital feedback control signal, such as previously described for example. At 717, a sampling window may be dynamically adjusted to provide a windowed portion of such analog signal sampled, where such windowed portion is determined responsive to such feedback control signal and sampling signal. Again such sampling window may be symmetrically positioned responsive to such window position or asymmetrically positioned responsive to such window position. Furthermore, again, such sampling window may be full scale responsive to a rate of change in such sampled portion of an analog signal for a low loss channel or may be substantially less than full scale responsive to such rate of change being for a high loss channel.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. An apparatus, comprising:
an analog-to-digital converter ("ADC") having a bank of comparators and a window controller;
wherein the window controller is coupled to the bank of comparators to selectively activate first comparators of the bank of comparators associated with a window size and to selectively inactivate second comparators of the bank of comparators; and
a decoder of the ADC coupled to receive outputs from the bank of comparators to provide an N bits wide digital code;
wherein the window controller is coupled to receive the digital code as a feedback control signal from the decoder.

2. The apparatus according to claim 1, wherein the window controller is coupled to receive a sample clock signal to dynamically window the first comparators for activation.

3. The apparatus according to claim 1, wherein the window controller is configured to determine voltage range of an analog signal input provided to the ADC over subsequent conversion cycles.

4. The apparatus according to claim 1, further comprising:
a resistor ladder of the ADC coupled to the bank of comparators; and
an equalization and decision module of the ADC coupled to the decoder to receive the digital code to provide a digital serial output signal.

5. The apparatus according to claim 4, further comprising a signal processing and parallelization block coupled to receive the digital serial output signal from the ADC to provide a digital parallel output signal from the signal processing and parallelization block.

6. An apparatus, comprising:
a window controller having a profiler, at least one look-up table, a window position generator, and a selective activation block;
wherein the profiler is coupled to receive a feedback control signal to provide a rate of change signal;
wherein the at least one look-up table has a set of granularity values and a set of window size values, wherein a window granularity value and a window size value are respectively selectable therefrom responsive to the rate of change signal;
wherein the window position generator is coupled to receive the feedback control signal to provide a window position value; wherein the selective activation block is coupled to receive the window granularity value, the window size value, and the window position value to provide a set of activation signals; and
a decoder coupled to receive outputs from a bank of comparators to provide an N bits wide digital code;
wherein the window controller is coupled to receive the digital code from the decoder as the feedback control signal.

7. The apparatus according to claim 6, wherein the bank of comparators is coupled to the window controller to selectively activate first comparators of the bank of comparators associated with the set of activation signals and to selectively inactivate second comparators of the bank of comparators not part of the set of activation signals.

8. The apparatus according to claim 7, wherein the window controller is coupled to receive a sample clock signal and the feedback control signal to dynamically window the first comparators for activation.

9. The apparatus according to claim 8, further comprising:
a resistor ladder coupled to the bank of comparators; and
an equalization and decision module coupled to the decoder to receive the digital code to provide a digital serial output signal.

10. The apparatus according to claim 8, wherein the decoder is a thermometer decoder.

11. A method, comprising:
receiving an analog input signal to an analog-to-digital converter ("ADC"); and
converting the analog input signal to a digital parallel output signal with the ADC;
wherein the converting comprises:
determining a rate of change of the analog signal;
generating a window position for conversion of a windowed portion of the analog signal;
selecting a window size and a window granularity for the windowed portion responsive to the rate of change;
providing a set of activation signals responsive to the window size, the window granularity, and the window position for the conversion of the windowed portion of the analog signal;
wherein the determining, the generating, and the selecting are all performed in the digital domain;
wherein the set of activation signals are provided to a bank of comparators for selective activation of a plurality of comparators of the bank of comparators;
wherein the rate of change and the window position are responsive to a feedback control signal;
decoding with a decoder an output from the bank of comparators to provide a digital version of at least the windowed portion of the analog signal as an N bits wide digital code;
feeding back the digital code from the decoder to a window controller as the feedback control signal; and
dynamically adjusting a sampling window to provide the windowed portion responsive to the feedback control signal and a sampling signal.

12. The method according to claim 11, wherein the determining, the generating, and the selecting are performed dynamically responsive to the feedback control signal and the sampling signal.

13. The method according to claim 12, wherein the sampling window is symmetrically positioned responsive to the window position.

14. The method according to claim 12, wherein the sampling window is asymmetrically positioned responsive to the window position.

15. The method according to claim 1, wherein the sampling window is full scale responsive to the rate of change being for a low loss channel.

16. The method according to claim 12, wherein the sampling window is substantially less than full scale responsive to the rate of change being for a high loss channel.

* * * * *